United States Patent
Paul et al.

(10) Patent No.: US 11,029,383 B2
(45) Date of Patent: Jun. 8, 2021

(54) OPERATING A MAGNETIC RESONANCE DEVICE

(71) Applicant: Siemens Healthcare GmbH, Erlangen (DE)

(72) Inventors: Dominik Paul, Bubenreuth (DE); Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 169 days.

(21) Appl. No.: 16/272,625

(22) Filed: Feb. 11, 2019

(65) Prior Publication Data
US 2019/0250236 A1  Aug. 15, 2019

(30) Foreign Application Priority Data
Feb. 12, 2018 (DE) .................. 10 2018 202 137.6

(51) Int. Cl.
*G01R 33/565* (2006.01)
*G01R 33/44* (2006.01)
(Continued)

(52) U.S. Cl.
CPC ... *G01R 33/56509* (2013.01); *G01R 33/3415* (2013.01); *G01R 33/443* (2013.01);
(Continued)

(58) Field of Classification Search
CPC .............. G01R 33/3415; G01R 33/443; G01R 33/5608; G01R 33/5611; G01R 33/56509; G01R 33/583
See application file for complete search history.

(56) References Cited

U.S. PATENT DOCUMENTS

2005/0096534 A1* 5/2005 Zhu ..................... G01R 33/5611
600/422
2009/0284257 A1* 11/2009 Bammer .......... G01R 33/56509
324/307
(Continued)

OTHER PUBLICATIONS

German Office Action for related German Application No. 102018202137.6, dated Jul. 8, 2020.

*Primary Examiner* — Steven L Yeninas
(74) *Attorney, Agent, or Firm* — Lempia Summerfield Katz LLC (57) ABSTRACT

A method for operating a magnetic resonance device includes using an acquisition technique using a plurality of coil elements of a transmit and/or receive coil in parallel. For each coil element, a sensitivity map describing the spatial sensitivity of the respective coil element is acquired at the start of the acquisition procedure and used in the reconstruction of a magnetic resonance image dataset from the magnetic resonance data. Magnetic resonance data of the individual coil elements is thus merged. Reference information indicating the position of the patient and/or of the coil elements is measured at the start of the examination procedure. Comparison information supplementary thereto is measured during the acquisition procedure. A reacquisition of at least a portion of the sensitivity maps is performed if at least one recalibration criterion describing a deviation exceeding a threshold value is fulfilled in a comparison of the comparison data with the reference data.

17 Claims, 3 Drawing Sheets

(51) Int. Cl.
*G01R 33/561* (2006.01)
*G01R 33/58* (2006.01)
*G01R 33/3415* (2006.01)
*G01R 33/56* (2006.01)

(52) U.S. Cl.
CPC ...... *G01R 33/5608* (2013.01); *G01R 33/5611* (2013.01); *G01R 33/583* (2013.01)

(56) References Cited

U.S. PATENT DOCUMENTS

| | | |
|---|---|---|
| 2011/0080167 A1 | 4/2011 | Kannengisser et al. |
| 2012/0002859 A1 | 1/2012 | Huang et al. |
| 2013/0278263 A1 | 10/2013 | Huang et al. |
| 2014/0210469 A1* | 7/2014 | Cheng ............... G01R 33/56509 324/309 |
| 2015/0002149 A1* | 1/2015 | Nehrke ................ G01R 33/246 324/309 |
| 2015/0323618 A1* | 11/2015 | Merfeld ............. G01R 33/3804 324/321 |
| 2016/0187446 A1* | 6/2016 | Zhou ................ G01R 33/5611 324/309 |
| 2017/0115369 A1* | 4/2017 | De Weerdt ......... G01R 33/4818 |
| 2017/0254867 A1* | 9/2017 | Choi ................ G01R 33/56509 |
| 2020/0249302 A1* | 8/2020 | Van Den Brink ... G01R 33/583 |

* cited by examiner

OPERATING A MAGNETIC RESONANCE DEVICE

This application claims the benefit of DE 10 2018 202 137.6, filed on Feb. 12, 2018, which is hereby incorporated by reference in its entirety.

BACKGROUND

The present embodiments relates to operating a magnetic resonance device during acquisition of magnetic resonance data by at least one magnetic resonance sequence.

Magnetic resonance imaging has become established as part of clinical routine and is used for acquiring magnetic resonance data of patients, whereby nuclear spins of the patient aligned in a basic magnetic field are excited by a radiofrequency excitation pulse and the decay of the excitation is measured. Radiofrequency coils are employed for outputting the excitation pulse and for measuring the actual magnetic resonance signal, with transmit-only coils, receive-only coils, and combined transmit/receive coils being known for this purpose.

In this context, acquisition techniques that use a plurality of coil elements of the corresponding radiofrequency coil during transmission and/or reception (e.g., multiple transmit and/or receive channels) are becoming increasingly important. Acquisition techniques of the type also include, for example, parallel imaging techniques, the use of which enables the measurement time to be shortened significantly. For example, one or more local coil arrays often having a high number of channels may be used in a parallel acquisition technique.

Known parallel imaging or acquisition techniques include GRAPPA, SENSE, SMS, compressed sensing, among others. Generally, the individual coil channels (e.g., the magnetic resonance data of the individual coil elements) are reconstructed first and are subsequently combined into an overall magnetic resonance image dataset. At the same time, a sensitivity map of the respective coil elements is used, which permits the magnetic resonance data of the coil elements to be weighted in the final combination image according to actual sensitivity. The sensitivity maps are obtained during this process in a calibration procedure, typically by reference scans. The calibration procedure is performed once at the start of an acquisition procedure at a specific position of the patient couch of the magnetic resonance device. The sensitivity maps are also to provide a uniform illumination of the image during the combination of the magnetic resonance data of the individual channels (e.g., normalization).

In the course of the acquisition of the magnetic resonance data (e.g., during the acquisition procedure), a change in the position of the local coils (and consequently of the coil elements) and/or of the patient (e.g., due to repositioning of extremities) may occur, for example, due to patient movement and/or due to actions of the operating staff (e.g., introducing a contrast agent access). This may result in the sensitivity maps no longer being entirely correct, which may lead to different (e.g., severe; with GRASP) image artifacts. With regard to the normalization, a change in position occurring between the calibration procedure and the measurement of the magnetic resonance data may lead to local increases or reductions in intensity.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a reduction in artifacts due to position changes during imaging using a plurality of coil elements and, consequently, an increase in image data quality are provided.

According to the present embodiments, in a method, reference information indicating a position of a patient and/or a position of the coil elements is measured at a start of an examination procedure. Comparison information supplementary thereto is measured at at least one time instant during the acquisition procedure. A reacquisition of at least a portion of the sensitivity maps is performed if at least one recalibration criterion describing a deviation exceeding a threshold value is fulfilled in a comparison of the comparison data with the reference data.

The position of the coil elements or the position of the patient is checked during the measurement of the magnetic resonance data (e.g., prior to each new application of one of the at least one magnetic resonance sequences). A reacquisition of sensitivity maps is triggered if deviations of a specific severity occur. During this process, at the time of the acquisitions of the sensitivity maps, comparison information describing the position of the patient and/or of the coil elements at the time is also measured in a calibration procedure by a measuring device. In this case, a measurement procedure that may either be performed in parallel with the magnetic resonance imaging or else is completed in an extremely short time in order not to lengthen the overall acquisition time significantly may be provided. Where applicable, the measurement procedure may also prevent a movement during the acquisition of the reference information and subsequently of the comparison information. Using the measuring device, comparison information is acquired at a later time during the acquisition procedure in the same way as the reference information and may be compared with the reference information in order to identify changes in position. If a reacquisition of the sensitivity maps is triggered, the current comparison information may replace the previous reference information so that the monitoring will then be performed relative to this new time instant.

In this way, according to one or more of the present embodiments, a time-saving detection of changes in position of coil elements and/or of the patient between partial acquisitions of the magnetic resonance data, which may lead to a triggering of reacquisitions of the sensitivity maps, is provided. In this way, it is possible to avoid artifacts, poor image illumination, misdiagnoses, and the need to perform a new acquisition of the magnetic resonance data. An improvement in image quality is therefore achieved as a result.

In one embodiment, sensors that are at least in some cases external to the magnetic resonance device (e.g., sensors provided on the coil elements and/or a camera recording the examination region of interest) may be provided as the measuring device for measuring the reference information and the at least one piece of comparison information. Examples of such sensors provided as separate hardware include sensors integrated into the transmit and/or receive coil (e.g., position sensors and/or Hall sensors), cameras, and/or external pilot tone navigators. In this case, the pilot tone signal, for example, may be generated by an independent CW radiofrequency source and received by the standard magnetic resonance coils.

In one embodiment, it may be provided that the measurement of the reference information and the at least one piece of comparison information is performed by the magnetic resonance device (e.g., as measuring device) using a navigator sequence applied outside of the at least one magnetic resonance sequence (e.g., prior to each partial acquisition by a magnetic resonance sequence). Thus, in order to monitor the changes in position, an extremely short navigator scan is provided prior to each imaging scan (e.g., each partial acquisition). In one embodiment, the duration of the navigator sequence is less than 100 ms (e.g., including only a few milliseconds). In this way, external sensors that in some cases may only be realized with difficulty and at additional cost may be avoided. A further advantage compared to motion detection using external sensors (e.g., cameras) is that only medium-term time differences are taken into account. The navigator sequence beneficially delivers comparison information at the start of each partial acquisition (e.g., at the start of each application of one of the at least one magnetic resonance sequences), which has proven to be a beneficial time instant for the measurement. With monitoring by external sensors (e.g., a continuously present monitoring process), a strong patient movement or a repositioning of the patient couch performed by the operating staff in the time between the acquisition of the reference information and the acquisition of the magnetic resonance data may exceed the tolerance threshold of the external motion detection in most cases or trigger a reacquisition of the sensitivity maps, which may be unnecessary. The external motion detection (e.g., in the case of cameras) has the further disadvantage that the external motion detection may only be employed with difficulty in certain situations (e.g., in abdominal magnetic resonance imaging).

Compared with sequence-inherent navigators, as have likewise already been proposed in the prior art (e.g., for motion correction), the use of a navigator sequence lying outside of the at least one magnetic resonance sequence has the advantage that the navigator sequence also delivers meaningful comparison data between multiple executions of the at least one magnetic resonance sequence. Sequence-inherent navigators, however, are generally specific to one magnetic resonance sequence due to relaxation, dead times, and the like that are to be taken into account, and permit a correction/assessment only within the execution of the respective magnetic resonance sequence.

In this case, the navigator sequence may use all of the coil elements that are also used within the scope of the acquisition procedure. However, as will be described in more detail hereinbelow, an evaluation or comparison may also be performed with respect to individual coil elements or subgroups of coil elements.

A development provides that the navigator sequence is a projection measurement providing, for example, no phase encoding gradient and/or a two- or three-dimensional measurement and/or a gradient echo sequence or a spin echo sequence. The navigator scan may therefore be performed either two- or three-dimensionally without phase encoding or at low resolution with phase encoding. If no phase encoding gradient is used, a projection is accordingly present. In this case, a two- or three-dimensional execution is recommended, mainly for the reason that an improved comparison basis is established.

In one embodiment, the acquisition region of the navigator sequence may lie within the acquisition region of the at least one magnetic resonance sequence and/or include an edge of the field of view of the magnetic resonance device, but within the field of view, and/or at least one slice in the acquisition region and/or the field of view. For example, slices of a specific slice thickness (e.g., a slice thickness of 10 to 20 mm) that are distributed over the complete field of view may be used, while the use of a single, judiciously positioned slice may also already be sufficient. An acquisition of at least a part of the reference information and comparison information from a region lying at the edge of the field of view may be advantageous with regard to the detection of a movement of the extremities.

In an exemplary navigator scan, five axial slices distributed over the complete field of view and having a slice thickness of 15 mm may be acquired, for example, where in each case, a k-space line with right-to-left readout direction without phase encoding gradient (e.g., corresponds to an anterior-posterior projection) is recorded within a few milliseconds, for example, by a spin echo or gradient echo sequence. The comparison may then be based on sum-of-squares projections, for example.

As already mentioned, changes in position of coil elements and/or of the patients may be determined by comparing the comparison information with the reference information. Correlation coefficients (e.g., Pearson correlation coefficients) have, in this case, proven to be a particularly advantageous choice for a comparison metric (e.g., when a navigator sequence is used). These correlation coefficients represent a measure of the linear correlation between two values, resulting in a value between −1 and +1. A value of +1 represents total positive linear correlation, a value of 0 represents no linear correlation, and a value of −1 represents total negative linear correlation.

Alternatively or in addition to the use of correlation coefficients and/or other comparison measures, the use of artificial intelligence algorithms (e.g., deep-learning algorithms) is also possible within the scope of the comparison. This applies, for example, when detailed information that describes or classifies the type of change that has occurred and is to be evaluated by the at least one recalibration criterion is to be determined in addition. However, such detailed information may also be ascertained in some other way, as will be explained in more detail below (e.g., by region- and/or coil element-specific comparison).

In a development of the method, at least one further calibration procedure (e.g., a shim operation and/or a center frequency adjustment) may also be repeated if at least one of the at least one recalibration criteria is fulfilled. Since shim operations and/or center frequency adjustments are also typically aimed at the positioning of the patient and/or of the coil elements, it may be beneficial, at least when specific conditions are met, in addition to the recalibration through acquisition of sensitivity maps, to repeat calibration procedures also in this regard. Image artifacts to that effect are thus avoided, and a high image quality is provided. For example, in the event of relatively minor deviations, a reacquisition of the sensitivity maps may initially be triggered. In the case of more serious deviations, not only a reacquisition of the sensitivity maps is triggered by a further recalibration criterion, but also an additional repetition of the at least one further calibration procedure is performed.

In other words, it may therefore be provided that an additional repetition of the at least one further calibration procedure is performed if a recalibration criterion describing a higher deviation is fulfilled by a second threshold value that is higher than a first threshold value of a recalibration criterion that triggers only a reacquisition of the sensitivity maps. For example, a first threshold value for a first recalibration criterion may therefore be provided (e.g., a change in the correlation coefficient of 5% or a specific value of the correlation coefficient). The exceeding of the first threshold value by the deviation causes a reiteration of the measurement of the sensitivity maps to be triggered. If a second threshold value (e.g., a deviation of 10%) in a second recalibration criterion is exceeded, it may, however, be provided that both the sensitivity maps are remeasured and at least one of the at least one further calibration procedures is performed. A gradation according to the identified deviation may therefore be provided.

In one embodiment, the comparison of the reference information with the comparison information is conducted on a coil element-specific and/or a region-specific basis in order to determine a piece of detailed information. At least one of the at least one recalibration criteria evaluates the detailed information. For example, detailed information related to regions at the edge of the field of view that describes whether a movement of extremities has taken place may be determined. Further coil element-specific and/or region-specific deviation patterns occurring may be assigned to other types of changes that have occurred (e.g., in accordance with a classification that may lead to different resulting calibration operations that are to be repeated). For example, if, in the case of detailed information indicating a coil displacement, only the sensitivity maps are reacquired, and/or in the case of detailed information indicating a body and/or extremities movement, both the remeasurement of the sensitivity maps and at least one of the at least one further calibration procedures are performed. If only positions of coil elements have changed, it may be sufficient simply to recalculate the sensitivity maps, since the patient mainly triggering, for example, inhomogeneities that are to be shimmed or taken into account by center frequency adjustment is unchanged. If, however, something on the patient himself/herself changes (e.g., due to corresponding movement), new shim operations and/or a new center frequency adjustment may be triggered in addition.

In addition to the method, the present embodiments also relate to a magnetic resonance device including a transmit and/or receive coil having a plurality of coil elements and a control device embodied to carry out a method according to the present embodiments. All statements in relation to the method according to the present embodiments may be applied analogously to the magnetic resonance device according to the present embodiments, such that the already cited advantages may also be obtained by the magnetic resonance device. For example, in addition to a sequencing unit provided in any case for acquisition control, the control device may include a measuring unit that, when using a navigator sequence, makes use of the sequencing unit or may correspond to the latter for acquisition of the reference information and the comparison information. The control device may also include a comparison unit for conducting the comparison, a recalibration monitoring unit for evaluating the at least one recalibration criterion, and a calibration unit for performing the calibrations. The control device may further include at least one processor and/or at least one memory device, which are used accordingly.

A computer program according to the present embodiments may, for example, be loaded directly into a memory of a control device of a magnetic resonance device and has one or more programs in order to carry out the acts of a method according to the present embodiments when the computer program is executed in the control device of the magnetic resonance device. The computer program may be stored on an electronically readable data medium (e.g., a non-transitory computer-readable storage medium) according to the present embodiments. The electronically readable data medium therefore includes electronically readable control information (e.g., instructions) stored thereon. The instructions include at least one cited computer program and is embodied such that the instructions perform a method according to the present embodiments when the data medium is used in a control device of a magnetic resonance device. The data medium according to one or more of the present embodiments may be, for example, a non-transitory data medium (e.g., a CD-ROM).

DETAILED DESCRIPTION

Figure 1:
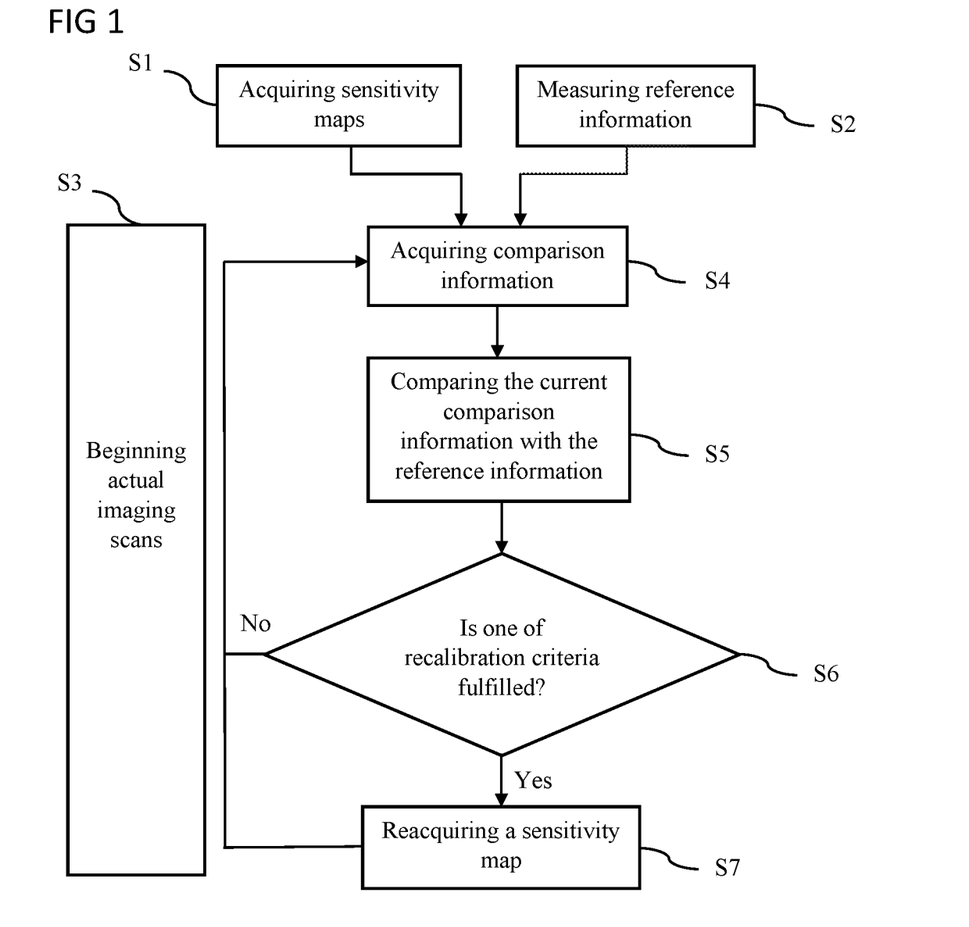
FIG. 1 shows a flowchart of one embodiment of a method.

FIG. 1 shows a flowchart of an exemplary embodiment of a method. The method relates to an acquisition procedure on a patient, where at least one magnetic resonance sequence (e.g., a plurality of magnetic resonance sequences) is to be applied. A transmit and/or receive coil (e.g., a local coil) having a plurality of coil elements (e.g., 30 coil elements) is used in this case for excitation purposes and/or for the acquisition of the magnetic resonance signals, where the number of coil elements may correspond to the number of transmit/receive channels. A parallel acquisition technique is therefore used.

For this purpose, in act S1, as is generally known, sensitivity maps for the individual coil elements are measured in a calibration procedure. Further calibration procedures (e.g., shim operations) and a center frequency adjustment are also performed in act S1 Immediately after, prior to or during act S1, therefore indicated in parallel, reference information indicating the position of the patient and of the coil elements is measured in act S2. In the present exemplary embodiment, a navigator sequence is used for this purpose. This provides that the magnetic resonance device simultaneously serves as a measuring device for the reference information and comparison information at subsequent time instants. In the present case, a navigator sequence that, in five slices having a slice thickness of 15 mm and distributed over the complete field of view, measures a respective k-space line without phase encoding gradient, which accordingly corresponds to a projection, is used. The navigator sequence may be a spin echo sequence or a gradient echo sequence and has a duration of a few milliseconds (e.g., therefore, less than 100 ms; may therefore be performed extremely quickly). Navigator sequences measuring two-dimensionally and/or three-dimensionally (e.g., with phase encoding gradients) may also be used in other exemplary embodiments.

Figure 2:
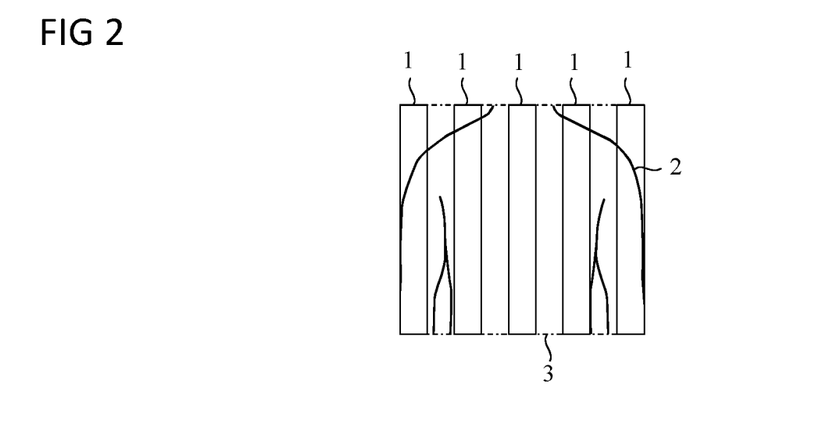
FIG. 2 shows possible acquisition slices for a navigator scan.

FIG. 2 schematically shows a possible arrangement of the five slices 1 in which the navigator sequence is used to perform the measurement. A human body 2 is also indicated. As shown, the outer two slices 1 at the edge of the field of view 3 indicated by a dashed outline are arranged such that the outer two slices 1 include extremities (e.g., the arms). An arrangement correspondingly rotated through 90°, in which case the slices 1 may then extend as far as the arms, may also be provided.

Returning to FIG. 1, the actual imaging scans then begin within the scope of the acquisition procedure using the at least one magnetic resonance sequence, which is indicated by act S3. In this case, in act S4, in turn using the navigator sequence, comparison information in addition to the reference information of act S2 is always acquired at the start of a new partial acquisition using one of the at least one magnetic resonance sequences. The comparison of the current comparison information with the reference information is conducted in act S5. During this process, detailed information more accurately describing/classifying any changes that may have occurred may also be ascertained by coil element-specific and/or region-specific comparison. For example, it may be established, by region-specific comparison of the outer slices 1 or from comparison data relating to the extremities, whether a repositioning of the extremities has taken place.

In the present example, projections are considered for the reference information, and the comparison information is considered for the purposes of the comparison. The projections are yielded as the sum of squares over the corresponding projection values of the individual coil elements for each of the slices 1. Exemplary curves of such sum-of-squares projections are produced from the graph of FIG. 3 for one of the slices 1, where curve 4 is the reference curve of the reference information, curve 5 results for the same positions of the patient and the coil elements at a later time instant, curve 6 was recorded following movement of coil elements, and curve 7 was determined after a flexing of the right arm of the patient.

A comparison measure in the form of a Pearson correlation value is used as the comparison result in the present example. In this case, a slice 1 extending from left to right is considered by way of example in FIG. 3, whereas FIG. 2 relates to an exemplary embodiment in which longitudinally extending slices 1 (e.g., rotated through) 90° are used.

Figure 3:
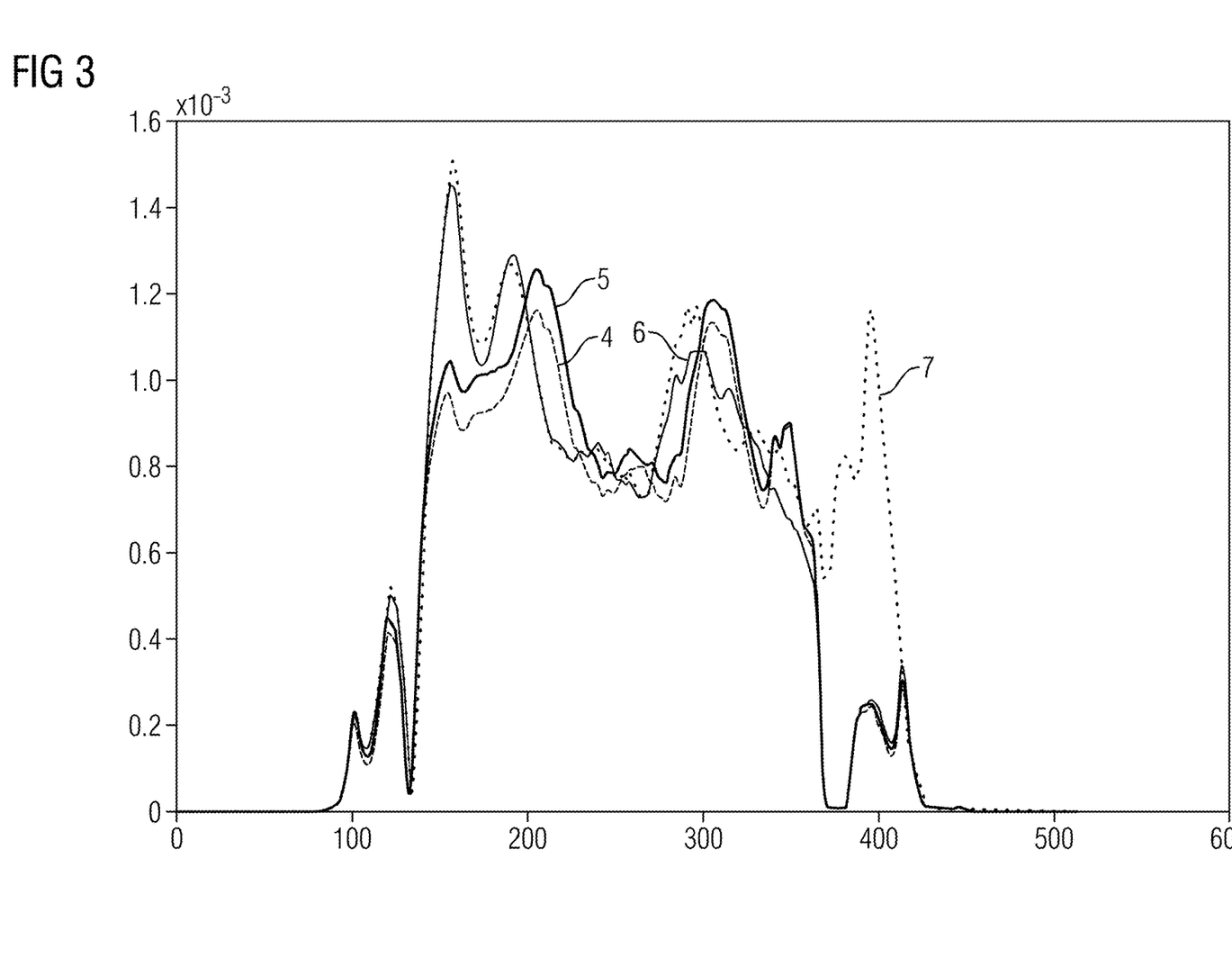
FIG. 3 shows the characteristic curve of an axial projection as the sum of squares of all coil elements for a reference state and different changes.

If the Pearson correlation value of curves 5, 6 and 7 is determined in addition to curve 4, an extremely high correlation close to one (e.g., of 0.997+0.015i) results for curve 4 and curve 5. In the comparison of curve 4 and curve 6, a significantly poorer Pearson correlation value of 0.707–0.055i is yielded, and a poor correlation of 0.718–0.061i likewise results for the comparison of curve 4 and curve 7.

Clearly, therefore, navigators of the type are excellently suited to identify relevant changes in the position of coil elements and the position of the patient.

In act S6, various recalibration criteria are now evaluated based on the comparisons. If one of the recalibration criteria is fulfilled, various calibration procedures, including at least the reacquisition of the sensitivity maps, are repeated in act S7. If none of the recalibration criteria are fulfilled in act S6, a return is made to act S4 so that comparison information is once again acquired by the navigator sequence at the start of the next partial acquisition using one of the at least one magnetic resonance sequences.

In a simple actual implementation of this exemplary embodiment, a single total correlation value is used as the comparison result. Two recalibration criteria are applied. A first recalibration criterion has a lower, first threshold value for the deviation, described by the correlation value, of the reference information from the comparison information. With such a minor deviation, it is deemed sufficient to perform a new acquisition of the sensitivity maps in act S7. The second recalibration criterion is assigned a second threshold value that describes a higher deviation of the comparison information from the reference information, with the result that in this case, in act S7, not only are the sensitivity maps remeasured, but in addition, at least one further calibration procedure is performed again (e.g., a shim operation and a center frequency adjustment).

In another actual implementation of this exemplary embodiment, detailed information is also determined in act S5 as a result of coil element-specific and/or region-specific evaluation and is evaluated by at least some of the recalibration criteria of act S6. In this case, it may be provided, for example, that only the sensitivity maps are remeasured if only a coil displacement occurred, but that new shim operations and/or center frequency adjustments also take place in addition in the event of a body and/or extremities movement.

When new sensitivity maps have been measured in act S7, the current comparison information is specified as new reference information.

While a navigator sequence may be used for measurement of the comparison information and the reference information in acts S2 and S4, external sensors of the magnetic resonance device may be used in addition or alternatively in order to determine at least a portion of the reference information and the comparison information (e.g., sensors provided on the transmit and/or receive coil itself, such as Hall sensors, and/or cameras).

Figure 4:
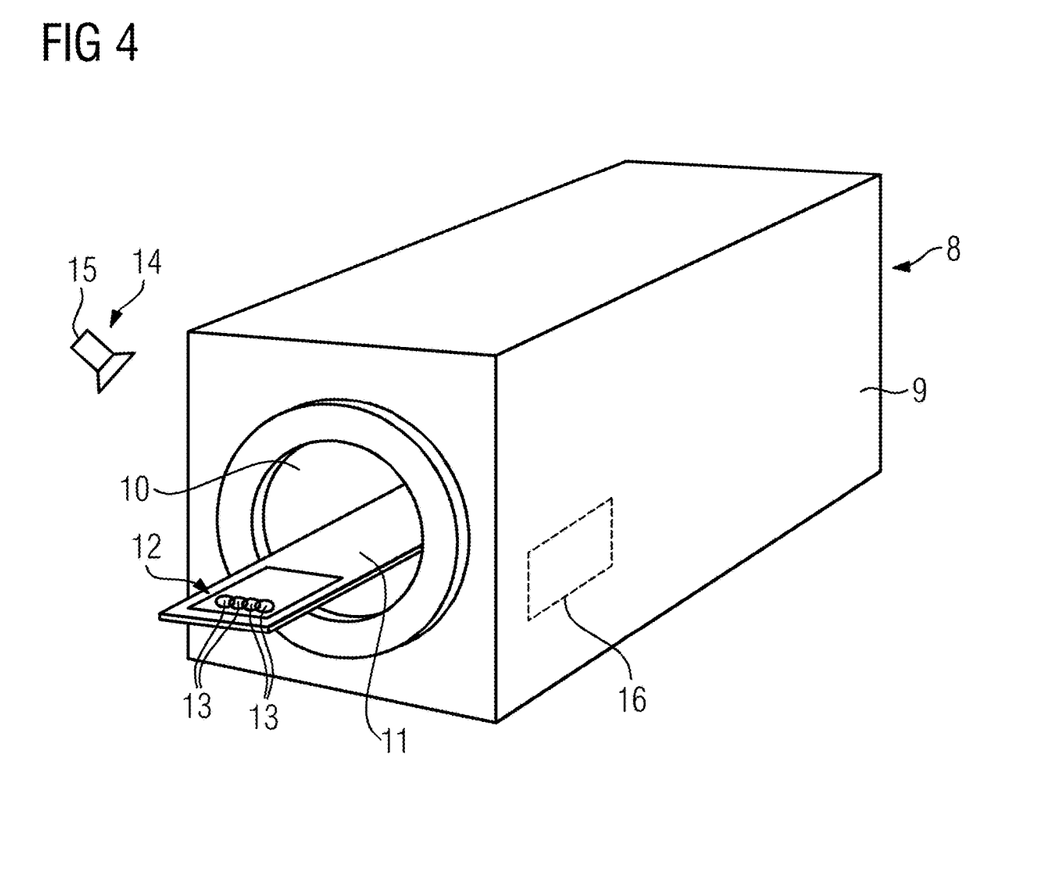
FIG. 4 shows a schematic diagram of a magnetic resonance device according to an embodiment.

FIG. 4 shows a schematic diagram of a magnetic resonance device 8 according to one or more of the present embodiments. As is generally known, the device includes a main magnet unit 9, in which there is embodied a patient receiving bore 10 into which a patient may be introduced by a patient couch 11. On the patient couch 11, an example of a transmit and/or receive coil 12 embodied as a local coil, which accordingly has a plurality of coil elements 13 for which sensitivity maps may be determined, is provided. The magnetic resonance device 8 also includes other inherently present components (e.g., a gradient coil array) that, for clarity of illustration reasons, are not shown here.

A camera 15 is also depicted as an example of an optimally deployable external sensor 14.

The operation of the magnetic resonance device 8 is controlled by a control device 16 that, in the present example, is embodied to carry out the method according to the present embodiments. The control device 16 (e.g., controller; one or more processors) includes, as already described in general terms, among other components, a sequencing unit for acquisition control, a measuring unit for acquisition of the reference information and the comparison information, a comparison unit for conducting the comparison, a recalibration monitoring unit for evaluating the at least one recalibration criterion, and a calibration unit for performing the adjustments.

Although the invention has been illustrated and described in more detail on the basis of the exemplary embodiments, the invention is not limited by the disclosed examples. Other variations may be derived herefrom by the person skilled in the art without leaving the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance device during acquisition of magnetic resonance data using at least one magnetic resonance sequence of an acquisition procedure, wherein an acquisition technique using a plurality of coil elements of a transmit, receive, or transmit and receive coil in parallel is used, the method comprising:
   for each coil element of the plurality of coil elements, acquiring a sensitivity map describing a spatial sensitivity of the respective coil element at a start of the acquisition procedure;
   merging magnetic resonance data of the individual coil elements, the merging of the magnetic resonance data comprising reconstructing a magnetic resonance image dataset from the magnetic resonance data using the sensitivity maps;
   measuring reference information indicating a position of a patient, the plurality of coil elements, or the patient and the plurality of coil elements at a start of an examination procedure;
   measuring supplementary comparison information at at least one time instant during the acquisition procedure; and
   remeasuring at least a portion of the sensitivity maps when at least one first recalibration criterion describing a deviation exceeding a first threshold value is fulfilled in a comparison of the supplementary comparison information with the reference information.

2. The method of claim 1, wherein sensors are used for measuring the reference information and measuring the supplementary comparison information, and
   wherein at least some of the sensors are external to the magnetic resonance device.

3. The method of claim 2, wherein the sensors are provided on the plurality of coil elements, on a camera recording an examination region of interest, or on the plurality of coil elements and on the camera.

4. The method of claim 1, wherein the measurement of the reference information and the measurement of the supplementary comparison information are performed by the magnetic resonance device using a navigator sequence applied outside of the at least one magnetic resonance sequence.

5. The method of claim 4, wherein the measurement of the reference information and the measurement of the supplementary comparison information are performed prior to each partial acquisition using a magnetic resonance sequence.

6. The method of claim 4, wherein the navigator sequence is a projection measurement.

7. The method of claim 6, wherein the projection measurement provides a no phase encoding gradient, a two- or three-dimensional measurement, a gradient echo sequence or a spin echo sequence, or any combination thereof.

8. The method of claim 4, wherein an acquisition region of the navigator sequence lies within an acquisition region of the at least one magnetic resonance sequence, comprises an edge of a field of view of the magnetic resonance device, but within the field of view of the magnetic resonance device, comprises at least one slice in the acquisition region, comprises the field of view of the magnetic resonance device, or comprises any combination thereof, or a combination thereof.

9. The method of claim 1, wherein a correlation coefficient is used as a comparison metric.

10. The method of claim 9, wherein a Pearson correlation coefficient is used as the comparison metric.

11. The method of claim 1, further comprising repeating at least one further calibration procedure when one or more of the at least one recalibration criteria is fulfilled.

12. The method of claim 11, wherein the at least one further calibration procedure comprises a shim operation, a center frequency adjustment, or the shim operation and the center frequency adjustment.

13. The method of claim 11, further comprising performing an additional repetition of the at least one further calibration procedure when a second recalibration criterion describing a higher deviation is fulfilled by a second threshold value that is higher than the first threshold value of the first recalibration criterion that triggers the remeasurement of the at least the portion of the sensitivity maps.

14. The method of claim 11, wherein the comparison of the reference information with the supplementary comparison information is conducted on a coil element, region-specific basis, or a combination such that detailed information is determined, and
   wherein one or more of the at least one recalibration criteria evaluates the detailed information.

15. The method of claim 14, wherein when the detailed information indicates a coil displacement, only the sensitivity maps are remeasured, when the detailed information indicates a body movement, extremities movement, or a combination thereof, both the remeasurement of the sensitivity maps and one or more of the at least one further calibration procedures are performed, or a combination thereof.

16. A magnetic resonance device comprising:
   a transmit, receive, or transmit and receive coil comprising a plurality of coil elements; and
   a controller configured to operate a magnetic resonance device during acquisition of magnetic resonance data using at least one magnetic resonance sequence of an acquisition procedure, wherein an acquisition technique using a plurality of coil elements of a transmit, receive, or transmit and receive coil in parallel is used, the operation of the magnetic resonance device comprising:
   for each coil element of the plurality of coil elements, acquisition of a sensitivity map describing a spatial sensitivity of the respective coil element at a start of the acquisition procedure;
   mergence of magnetic resonance data of the individual coil elements, the mergence of the magnetic resonance data comprising reconstruction of a magnetic resonance image dataset from the magnetic resonance data using the sensitivity maps;
   measurement of reference information indicating a position of a patient, the plurality of coil elements, or the patient and the plurality of coil elements at a start of an examination procedure;
   measurement of supplementary comparison information at at least one time instant during the acquisition procedure; and
   remeasurement of at least a portion of the sensitivity maps when at least one recalibration criterion describing a deviation exceeding a threshold value is fulfilled in a comparison of the supplementary comparison information with the reference information.

17. In a non-transitory computer-readable storage medium that stores instructions executable by one or more processors to operate a magnetic resonance device during acquisition of magnetic resonance data using at least one magnetic resonance sequence of an acquisition procedure, wherein an acquisition technique using a plurality of coil elements of a transmit, receive, or transmit and receive coil in parallel is used, the instructions comprising:

for each coil element of the plurality of coil elements, acquiring a sensitivity map describing a spatial sensitivity of the respective coil element at a start of the acquisition procedure;

merging magnetic resonance data of the individual coil elements, the merging of the magnetic resonance data comprising reconstructing a magnetic resonance image dataset from the magnetic resonance data using the sensitivity maps;

measuring reference information indicating a position of a patient, the plurality of coil elements, or the patient and the plurality of coil elements at a start of an examination procedure;

measuring supplementary comparison information at at least one time instant during the acquisition procedure; and remeasuring at least a portion of the sensitivity maps when at least one recalibration criterion describing a deviation exceeding a threshold value is fulfilled in a comparison of the supplementary comparison information with the reference information.

* * * * *